United States Patent
Isogai (10) Patent No.: US 7,595,236 B2
(45) Date of Patent: Sep. 29, 2009

(54) METHOD FOR PRODUCTION OF SEMICONDUCTOR DEVICE HAVING A HOLE EXTENDING THROUGH A FIRST INSULATING FILM, A SECOND INSULATING FILM AND A THIRD INSULATING FILM

(75) Inventor: Satoru Isogai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 40 days.

(21) Appl. No.: 11/564,613

(22) Filed: Nov. 29, 2006

(65) Prior Publication Data

US 2007/0123031 A1 May 31, 2007

(30) Foreign Application Priority Data

Nov. 30, 2005 (JP) ............................. 2005-346306
Sep. 20, 2006 (JP) ............................. 2006-253966

(51) Int. Cl.
*H01L 21/8242* (2006.01)
(52) U.S. Cl. ............... 438/243; 438/638; 257/E27.092; 257/E21.577
(58) Field of Classification Search ............. 216/41, 216/46; 438/689, 694, 696, 700, 386–387, 438/239, 243, 244, 637, 638, 957; 257/301, 257/774, E21.577, E27.092
See application file for complete search history.

(56) References Cited

U.S. PATENT DOCUMENTS 6,171,510 B1 * 1/2001 Lee ............................ 216/27
6,200,735 B1   3/2001 Ikegami
6,255,161 B1   7/2001 Lin
6,268,283 B1 * 7/2001 Huang ......................... 438/638
6,300,238 B1  10/2001 Lee et al.
6,800,535 B1 * 10/2004 Tsai et al. .................... 438/386
7,183,202 B2 * 2/2007 Lee et al. ..................... 438/638
2004/0219780 A1 11/2004 Ohuchi

FOREIGN PATENT DOCUMENTS

| JP | 10-92935 A | | 4/1998 |
| JP | 10092935 A | * | 4/1998 |
| JP | 10-29437 A | | 11/1998 |
| JP | 11-186225 A | | 7/1999 |
| JP | 11-214512 A | | 8/1999 |
| JP | 11-354499 A | | 12/1999 |
| JP | 2004-335526 A | | 11/2004 |
| JP | 2005159363 A | | 6/2005 |
| JP | 2006222208 A | | 8/2006 |

* cited by examiner

*Primary Examiner*—Khiem D Nguyen
(74) *Attorney, Agent, or Firm*—Sughrue Mion, PLLC (57) ABSTRACT

A short circuit with an adjacent hole is prevented. By enlarging a hole diameter in the lower part of the hole, a stable storage node is formed without causing a decrease in capacitance. Provided is a method for production of a semiconductor device, comprising the steps of: forming the second hole in the second insulating film to a depth at which a bowing shape does not occur by carrying out anisotropic etching; forming the fourth film on the side surfaces of the first and the second holes; forming the second hole of an aspect ratio greater than 12 by extending the second hole until the first insulating film is exposed by carrying out anisotropic etching; and extending by isotropic etching a side surface portion of the second hole on which the fourth film is not formed.

8 Claims, 6 Drawing Sheets

METHOD FOR PRODUCTION OF SEMICONDUCTOR DEVICE HAVING A HOLE EXTENDING THROUGH A FIRST INSULATING FILM, A SECOND INSULATING FILM AND A THIRD INSULATING FILM

BACKGROUND OF THE INVENTION

1. Field of the Invention

The present invention relates to a method for production of a semiconductor device.

2. Description of the Related Art

It has become difficult to secure a sufficient capacitor capacitance in a DRAM with miniaturization of semiconductor devises in progress. For securing a sufficient capacitor capacitance, it is necessary to increase the height of the capacitor, to increase a surface area by employing a crown structure, and so on.

Above all, there is a method in which the surface area of a storage node is increased by employing a COB structure with a capacitor placed on a top layer of a bit line to increase the height of the storage node. Here, for increasing the height of the storage node, it is necessary to form a hole of a high aspect ratio.

Figure 1:
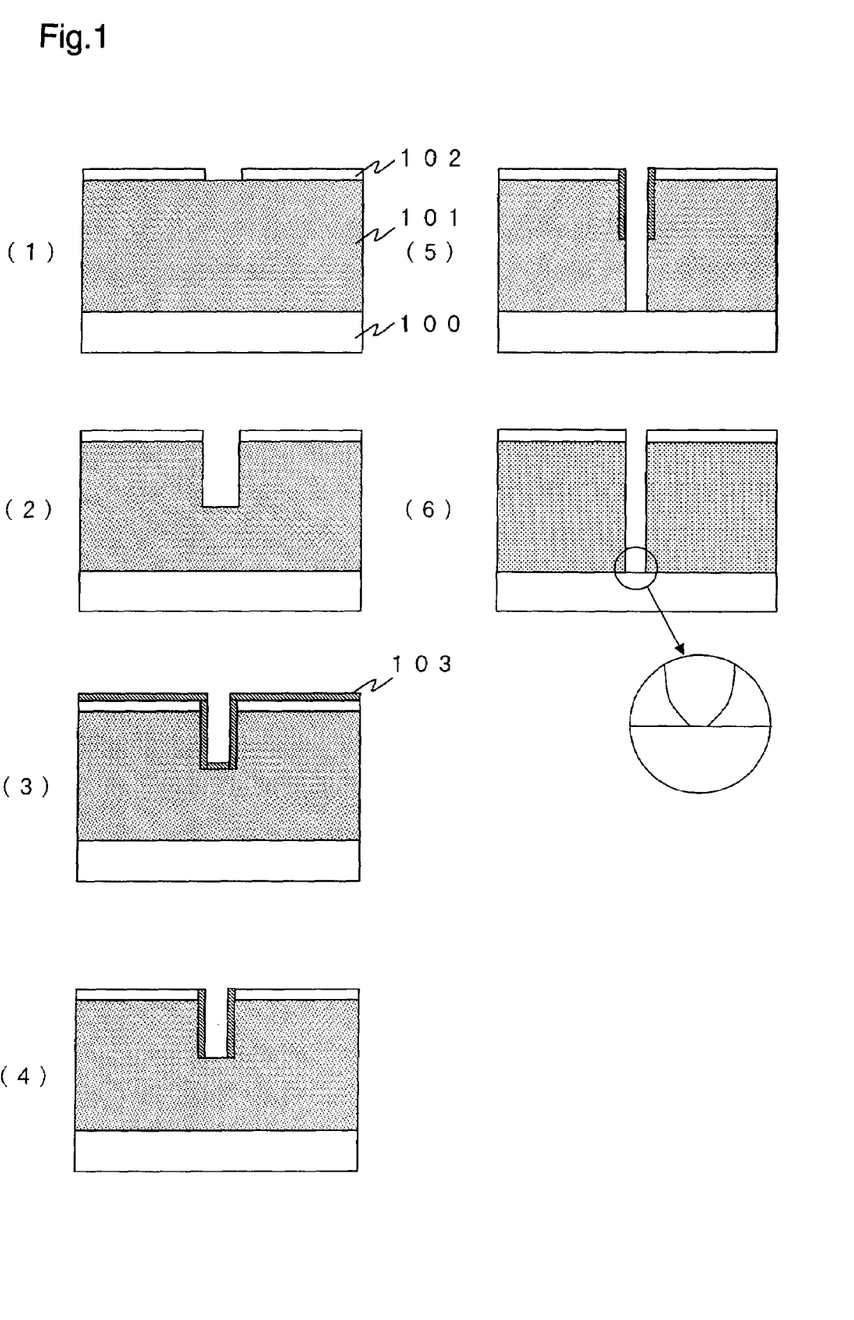
Figure 2:
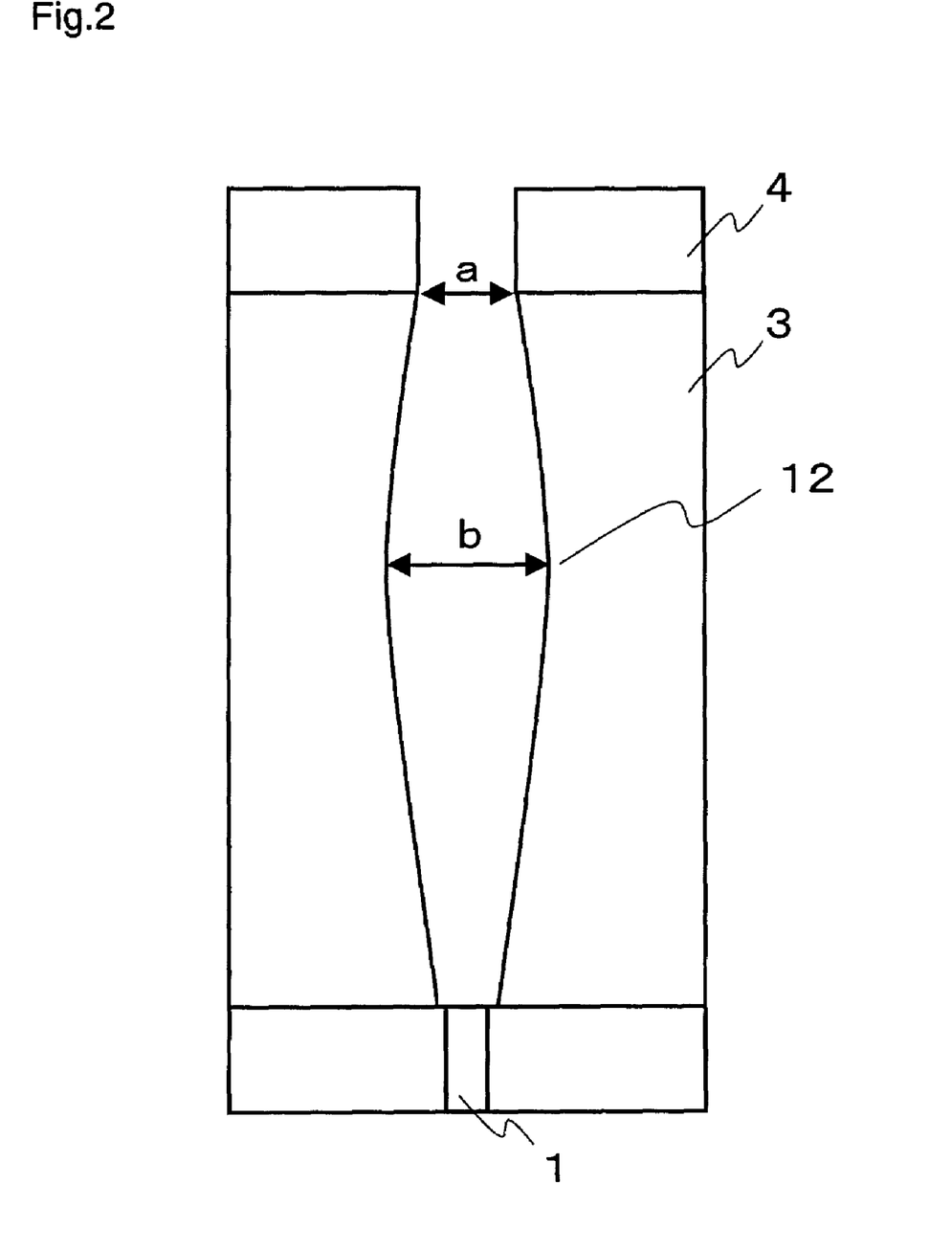
FIG. 2 is a view for explaining a bowing shape.

However, when a hole of a high aspect ratio is formed by conventional anisotropic etching, a geometrical abnormality called a bowing shape occurs. The bowing shape is a geometry in which the middle portion 12 of the hole expands and a hole diameter (b) of a middle portion 12 of the hole is larger than an entrance hole diameter (a) of an oxide film 3 just below a mask 4 when a hole section is circular as shown in FIG. 2. When the hole has a shape other than a circular shape, a sectional area Sb of the section of the middle portion 12 of the hole is larger than a sectional area Sa of an entrance hole of the mask (sectional area of an oxide film entrance just below the mask).

A process in which this bowing shape occurs when using a conventional production method is shown in FIGS. 3(A) to 3(F). First, a contact plug 1 as a primary layer, a nitride layer 2 as an etching stopper, an oxide film (interlayer insulating film) 3 and a polysilicon layer 4 as a hard mask are deposited one after another. Then, anisotropic etching is carried out by a lithography technique to pattern the polysilicon layer 4 (FIG. 3(A)). Next, the oxide film 3 is subjected to anisotropic etching using the patterned polysilicon layer 4 as a mask. At this time, etching proceeds mainly in a longitudinal direction 10. However, in a middle portion 11 of the oxide film, etching also proceeds in a lateral direction 12, and a geometrical abnormality called a bowing shape occurs (FIG. 3(B)). As a result, in the middle portion 11 of the hole, the distance between adjacent holes becomes very short, or the adjacent holes merge with each other.

The reason why the bowing shape thus occurs can be considered as follows. That is, when dry etching is carried out as anisotropic etching, charging occurs near the surface of a hole due to a difference in the amount of electrons and ions incident to the inside of a fine pattern when they are irradiated to the surface of a mask for forming a pattern in a plasma in which a gas is separated into electrons and ions. It can be considered that in this way, the course of incident ions is bent so that the ions impinge upon the middle portion 11 of the oxide film in the lateral direction 12. Furthermore, the ratio of incident ions being bent in the lateral direction is considerably influenced by the aspect ratio of the hole, and becomes noticeable when the aspect ratio exceeds 12. Thus, a bowing shape generally occurs when the aspect ratio exceeds 12.

Next, a wet etching treatment with a fluoric acid solution is carried out as a pretreatment for depositing a polysilicon layer. At this time, the distance between adjacent capacitors further decreases, and in the middle portion 11 of the hole, adjacent holes merge with each other (FIG. 3(C)).

Figure 3:
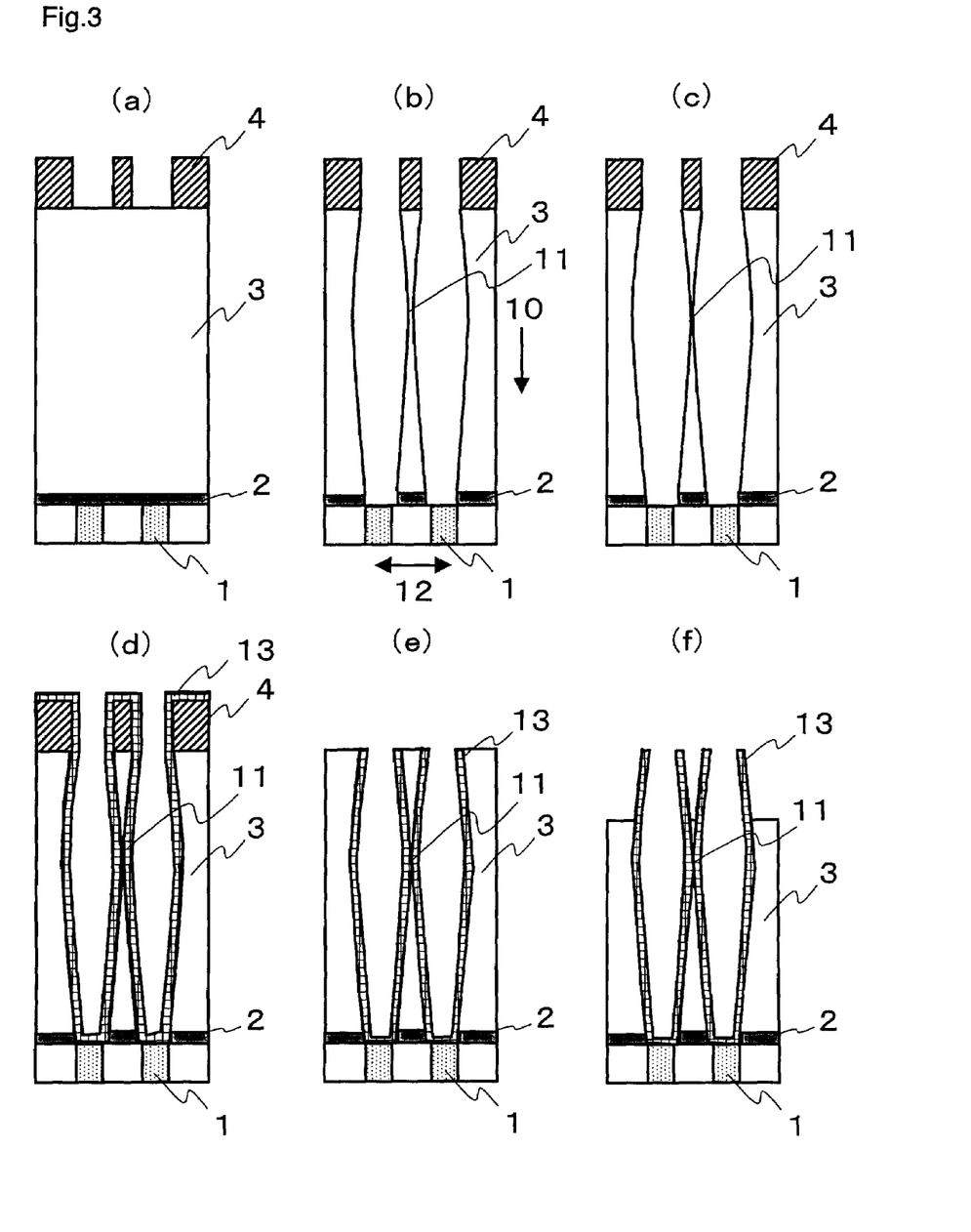

Thereafter, a polysilicon layer 13 is deposited on the entire surface (FIG. 3(D)), and the polysilicon layer 4 and the polysilicon layer 13 deposited on the top surface and the side surface of the polysilicon layer 4 are then removed (FIG. 3(E)). Further, thereafter, the oxide film 3 is partly removed by carrying out wet etching to expose a part of a lower electrode (polysilicon) to a desired height (FIG. 3(F)).

When a bowing shape thus occurs, there have arisen the following problems.

(1) When a conductive film such as a polysilicon film as a lower electrode is formed after formation of a hole, the conductive film is stepped and broken at the location of a bowing shape.

(2) When the bowing shape occurs, adjacent holes merge with each other to cause a short circuit.

(3) Even if a short circuit does not occur, the distance between adjacent contact holes decreases so that a parasitic capacitance increases to deteriorate device characteristics.

(4) If a conductive film is buried in a hole where a bowing shape occurs, a void occurs at a central portion of the hole. If the void occurs, a gas in the void expands to cause bursting in a subsequent heating step.

So, various methods for preventing the occurrence of the bowing shape have been proposed. FIGS. 1(1) to 1(6) is a process sectional view showing a production method for inhibiting a bowing shape, which is proposed in Japanese Patent Laid-Open No. 2004-335526 (Patent Document 1) by the applicant.

In this production method, first, a silicon substrate 100 is prepared, and a silicon oxide film 101 and polysilicon 102 as a hard mask at the time of etching are formed one after another on the silicon substrate 100. Next, by a photolithography technique, a hole is provided in a photoresist (not shown) formed on polysilicon 102 and polysilicon 102 is dry-etched by the hole to form a hard mask for etching. Thereafter, the photoresist is removed (FIG. 1(1)).

A hole of an aspect ratio of 7 or more and 12 or less having a depth at which a bowing shape does not occur is formed in the silicon oxide film 101 by the first etching via the hard mask 102 (FIG. 1(2)). Next, a $Si_3N_4$ film 103 is deposited on the entire surface by a low pressure CVD method (FIG. 1(3)). Thereafter, the entire surface is dry-etched to remove the $Si_3N_4$ film 103 deposited on the top surface of polysilicon 102 and the $Si_3N_4$ film 103 deposited on the bottom of the hole. The $Si_3N_4$ film 103 is left only on the side surface of the hole (FIG. 1(4)).

At this time, it is necessary that the $Si_3N_4$ film 103 left on the side surface of the hole should cover at least a position of an aspect ratio of 2 to 7 in which a bowing shape is caused to occur in the hole. Thereafter, a hole extending to the silicon substrate 100 is formed (FIG. 1(5)) and the $Si_3N_4$ film 103 left on the side surface of the hole is removed (FIG. 1(6)) while carrying out dry etching as the second etching.

Owing to the production method of Japanese Patent Laid-Open No. 2004-335526, occurrence of a bowing shape was somewhat inhibited, but as shown in the enlarged view of the circled portion in the lower part of the hole in FIG. 1(6), the hole width in the lower part of the hole was narrowed in some cases. In addition, with further miniaturization of wiring rules, the hole diameter itself further decreased and the aspect ratio of the hole further increased, and the hole diameter in the lower part of the hole further decreased.

Particularly, when HSG (hemispherical grained) polycrystalline silicon was formed in the lower part of the hole, formation of the lower part of the hole as in FIG. 1(6) brought HSG polycrystalline silicon into mutual contact in the lower part of the hole so that a surface area of a design value could not be obtained in some cases. Here, when the diameter of HSG polycrystalline silicon was reduced for preventing the contact of HSG polycrystalline silicon, the surface area of a cylinder decreased in some cases. Therefore, prevention of a decrease in the hole diameter in the lower part of the hole has been a serious problem.

So, the present inventor conducted vigorous studies, and resultantly found that (1) occurrence of a bowing shape can be prevented at the time of the second etching by providing a mask layer on a portion in a hole where the bowing shape occurs after the first etching and (2) the hole diameter in the lower part of the hole can be increased by newly providing a step of enlarging the hole diameter in the lower part of the hole (side surface portion in the hole on which a mask layer is not provided) after the second etching.

That is, an object of the present invention is to provide a method for production of a semiconductor device having a hole extending through the first insulating film, the second insulating film and the third insulating film, wherein a bowing shape does not occur even at a high aspect ratio and the lower part of a hole has a large hole diameter.

SUMMARY OF THE INVENTION

For solving the problems described above, the present invention is characterized by having the following configuration.

1. A method for production of a semiconductor device having a first insulating film, a second insulating film as an interlayer insulating film and a third insulating film on a substrate in this order and having a hole extending through the first insulating film, the second insulating film and the third insulating film, the method comprising the steps of:

(1) depositing the first insulating film, the second insulating film and the third insulating film on the substrate in this order;

(2) forming a first hole extending through the third insulating film along a direction of the thickness thereof;

(3) forming a second hole in the second insulating film in the lower part of the first hole to a depth at which a bowing shape does not occur by anisotropic etching using the third insulating film as a mask;

(4) forming a fourth film on the side surfaces of the first and the second holes;

(5) forming a second hole of an aspect ratio greater than 12 by extending the second hole until the first insulating film is exposed by carrying out anisotropic etching using the third insulating film and the fourth film as a mask and using the first insulating film as an etching stopper;

(6) removing the first insulating film exposed in the lower part of the second hole by anisotropic etching; and (7) extending a side surface portion of the second hole extended in the step (5), on which the fourth film is not formed, by isotropic etching using the third insulating film and the fourth film as a mask.

2. The method for production of a semiconductor device set forth in the item 1 above, wherein the first insulating film is a silicon nitride film, the second insulating film is a silicon oxide film, the third insulating film is a non-doped polysilicon film and the fourth film is a polysilicon film.

3. The method for production of a semiconductor device set forth in the item 2 above, wherein the polysilicon film constituting the fourth film is a conductive polysilicon film containing an impurity.

4. The method for production of a semiconductor device set forth in the item 1 above, wherein the depth at which the bowing shape does not occur is a depth at which the aspect ratio of the second hole is 7 or more and 12 or less.

5. The method for production of a semiconductor device set forth in the item 1 above, wherein the isotropic etching of the step (7) is wet etching.

In the production method of the present invention, a side wall (the fourth film) is formed with a material hard to be etched by isotropic wet etching on a portion where a short circuit with an adjacent hole easily occurs due to a bowing shape occurring when forming a storage node hole of a high aspect ratio by anisotropic etching using a conventional production method. In this way, a short circuit with an adjacent hole can be prevented. Furthermore, the hole diameter in the lower part of the hole smaller than a design value is enlarged by isotropic etching. In this way, a stable storage node can be formed without causing a decrease in capacitance.

BRIEF DESCRIPTION OF THE DRAWINGS

FIGS. 1(1) to 1(6) are process sectional views for explaining production steps for a conventional semiconductor device;

FIGS. 3(A) to 3(F) are process sectional views for explaining production steps for the conventional semiconductor device;

FIGS. 4(A) to 4(D) are process sectional views for explaining one example of production steps for a semiconductor device of the present invention;

FIGS. 5(A) to 5(D) are process sectional views for explaining one example of production steps for the semiconductor device of the present invention.

DETAILED DESCRIPTION OF THE INVENTION (Method for Production of Semiconductor Device)

The present invention provides a method for production of a semiconductor device having on a substrate the first insulating film, the second insulating film and the third insulating film in this order and having a hole extending through the first insulating film, the second insulating film and the third insulating film. The production method comprises the steps of:

(1) depositing on the substrate the first insulating film, the second insulating film and the third insulating film in this order;

(2) forming a first hole extending through the third insulating film along a direction of the thickness thereof;

(3) forming a second hole in the second insulating film in the lower part of the first hole to a depth at which a bowing shape does not occur by anisotropic etching using the third insulating film as a mask;

(4) forming a fourth film on the side surfaces of the first and the second holes;

(5) forming a second hole of an aspect ratio greater than 12 by extending the second hole until the first insulating film is exposed by carrying out anisotropic etching using the third insulating film and the fourth film as a mask and using the first insulating film as an etching stopper;

(6) removing by anisotropic etching the first insulating film exposed in the lower part of the second hole; and (7) extending a side surface portion of the second hole extended in the step (5), on which the fourth film is not formed, by isotropic etching using the third insulating film and the fourth film as a mask.

Here, the substrate may be, for example, a silicon substrate, a semiconductor element formed on a silicon substrate, a wiring, an insulating film or the like.

The third insulating film and the fourth film show etching selectivity (etching rate) different from that of the second insulating film under predetermined etching conditions. The first insulating film, the second insulating film, the third insulating film and the fourth film meet the following relationship of: the first insulating film, the third insulating film and the fourth film<the second insulating film in terms of the etching rate.

The first insulating film may be a silicon nitride film.

The second insulating film may be a silicon oxide film functioning as an interlayer insulating film. For the third insulating film, for example, a $Si_3N_4$ film, a silicon oxynitride film, a non-doped polysilicon film or the like may be used.

For the fourth film, for example, a $Si_3N_4$ film, a silicon oxynitride film, a non-doped polysilicon film, a doped polysilicon film, a SiGe film, a Ge film or the like may be used.

The first insulating film and the third insulating film may be formed of a same material or formed of different materials. However, when a same material is used as the first insulating film and the third insulating film, the third insulating film is etched at the same etching rate in the step (step (6)) of removing the first insulating film by anisotropic etching. Therefore, it is necessary that a thickness of the third insulating film should be larger than that of the first insulating film. Preferably, different materials are used for the first insulating film and the third insulating film and etching conditions are adjusted so that the third insulating film is etched at an etching rate lower than that of the first insulating film. The third insulating film and the fourth film may be formed of a same material or formed of different materials.

Figure 4:
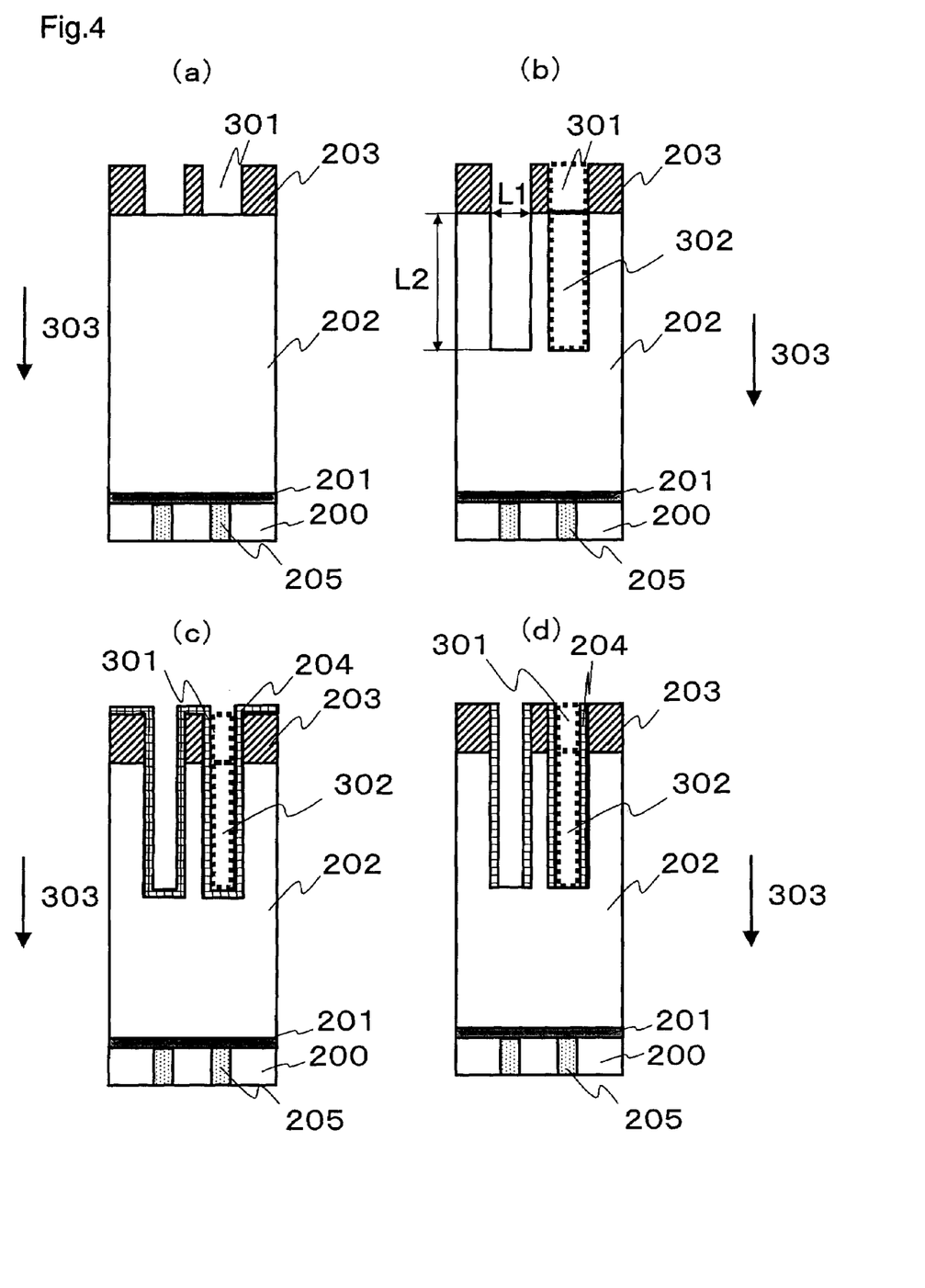

The thickness of the first insulating film (e.g. length in a direction 303 in FIG. 4(B)) is preferably 10 to 50 nm, more preferably 15 to 40 nm, further preferably 15 to 30 nm. The thickness of the second insulating film (e.g. length in the direction 303 in FIG. 4(B)) is preferably 1000 to 4000 nm, more preferably 2000 to 3500 nm, further preferably 2500 to 3000 nm. The thickness of the third insulating film (e.g. length in the direction 303 in FIG. 4(B)) is preferably 50 to 300 nm, more preferably 80 to 200 nm, further preferably 100 to 150 nm. The thicknesses of the first insulating film, the second insulating film and the third insulating film are within these ranges, whereby a semiconductor device having an excellent capacitance at a high aspect ratio can be produced in relation to the entrance hole diameter of the second hole.

Among these materials, a combination of a silicon nitride film as the first insulating film, a silicon oxide film as the second insulating film, a non-doped polysilicon film as the third insulating film and a polysilicon film as the fourth film is preferably used. The films are formed of these materials, whereby etching can be carried out more effectively in steps (3) and (5) to (7). A process margin when forming the second hole by etching can be increased. More preferably, a conductive polysilicon film containing an impurity is used as the fourth film. By using such a polysilicon film, the fourth film can be used as an excellent etching mask and a capacitor capacitance useful as a semiconductor device can be formed. In this connection, for the second insulating film, the entrance hole diameter or the entrance hole width and the thickness of the second insulating film are selected so that the aspect ratio of the second hole formed in step (5) exceeds 12.

In this connection, whether a bowing shape occurs or not depends on conditions such as the entrance hole diameter and the depth of the second hole. Typically, a bowing shape occurs when the aspect ratio exceeds 12. In addition, etching conditions and characteristics of the hole and occurrence of a bowing shape have the following relationships.

A bowing shape occurs at a shallow portion of the hole as the hole diameter increases.

When the pressure at the time of etching is increased, the maximum width of the bowing shape decreased and the depth at which the bowing shape occurs increases.

Steps constituting the production method of the present invention will be described below.

Step (1)

First, a substrate is prepared, and the first insulating film, the second insulating film and the third insulating film are deposited in this order on the substrate.

Step (2)

Next, the first hole extending through the third insulating film along a direction of the thickness thereof is formed by using a lithography technique or the like.

Step (3)

Thereafter, anisotropic etching is carried out using the third insulating film as a mask by adjusting etching conditions, and the second hole is formed in the second insulating film in the lower part of the first hole to a depth at which a bowing shape does not occur.

The "depth at which a bowing shape does not occur" is a depth at which the bowing shape shown in FIG. 2 does not occur. That is, at the time of this step, a bowing shape does not occur because the aspect ratio of the second hole does not exceed 12. However, a side surface portion of the second hole formed in this step includes a hole portion where a bowing shape occurs unless no treatment is carried out, when a hole of an aspect ratio greater than 12 is formed in the subsequent step.

The depth at which a bowing shape does not occur in step (3) is preferably a depth at which the aspect ratio of the second hole is 7 or more and 12 or less. When a hole of an aspect ratio greater than 12 is formed by extending the second hole along a direction of the thickness in subsequent step (5), a bowing shape typically occurs at a position in which the aspect ratio of the second hole in step (3) is 2 to 7. Therefore, in the present invention, occurrence of a bowing shape can be reliably prevented by forming a fourth film on the side surfaces of the first and the second holes in subsequent step (4). In this connection, for example, the aspect ratio in this step (3) is represented by L2/L1 using L1 and L2 of FIG. 4(B).

The second hole has an entrance cross-section which is typically circular. The diameter of the entrance cross-section is preferably 70 to 300 nm, more preferably 70 to 150 nm, further preferably 70 to 100 nm. When the second hole has such a small entrance hole diameter, an area near the surface of the second hole tends to be charged and a bowing shape easily occurs in a conventional production method. However, by using the production method of the present invention, even the second hole having such an entrance hole diameter can be formed effectively without causing a bowing shape to occur.

Step (4)

When the second hole is extended along the direction of the thickness thereof in the subsequent step, a bowing shape occurs in the portion of the second hole formed in step (3). Therefore, in step (4), a fourth film is formed on side surface portions of the first hole and the second hole formed in step (3). The fourth film acts as a mask at the time of etching in subsequent steps (5) and (7), whereby a bowing shape does not occur on the side surface portion of the second hole formed in step (3).

In step (4), for example, the fourth film is deposited on the entire surface of the structure formed in step (3), and then the fourth film is anisotropically etched with etching conditions adjusted, whereby the fourth film can be formed (left) only on the side surfaces of the first hole and the second hole. Namely, the fourth film deposited on the top surface of the third insulating film and the fourth film deposited on the bottom surface of the second hole are removed by anisotropic etching.

Step (5)

In step (5), anisotropic etching is carried out using the third insulating film and the fourth film as a mask and using the first insulating film as an etching stopper with etching conditions adjusted, whereby the second hole is extended until the first insulating film is exposed. At this time, the aspect ratio exceeds 12, and the second hole is formed so as to extend through the second insulating film.

In this step, the fourth film is formed as a mask for etching in a portion in which a bowing shape would occur in a normal method, and therefore this portion can be etched to effectively prevent occurrence of the bowing shape.

Here, the aspect ratio represents (depth of the second hole)/ (entrance opening diameter of the second hole) when the cross-section of the second hole is circular. The aspect ratio represents (depth of the second hole)/(entrance opening width of the second hole) when the cross-section of the second hole is quadrangular. Here, the entrance opening diameter or entrance opening width represents the diameter or width of the second hole at a surface of the second insulating film contacting the third insulating film. In this connection, it represents the hole diameter or hole width after formation of the fourth film if the fourth film is formed in the second hole.

Figure 5:
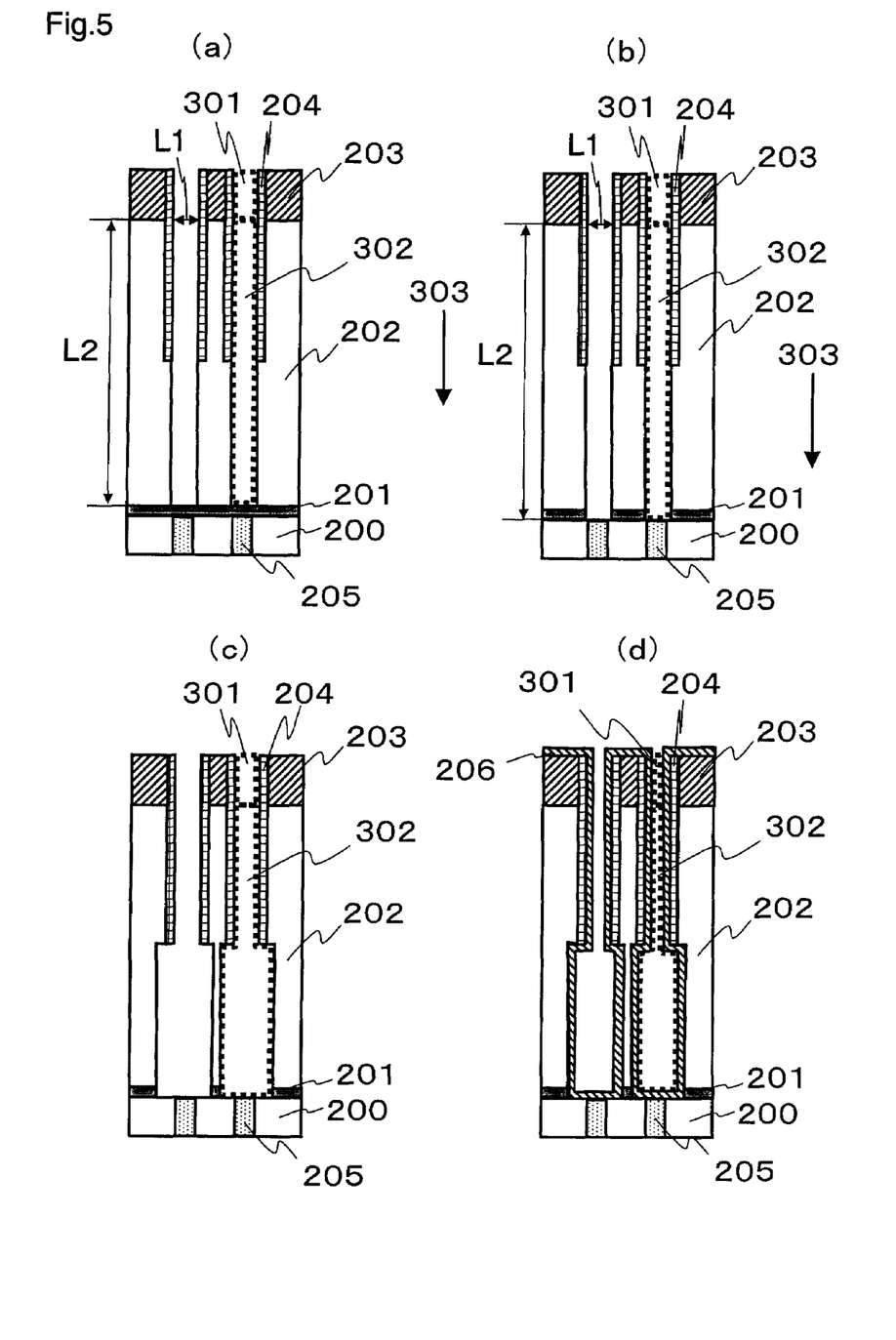

For example, the aspect ratio of the second hole formed in step (3) is represented by L2/L1 of FIG. 4(B). The aspect ratio of the second hole formed in step (5) is represented by L2/L1 of FIG. 5(A). L1 of FIG. 5(A) represents the entrance hole diameter of the second hole after formation of the fourth film. The aspect ratio of the second hole formed in step (6) is represented by L2/L1 of FIG. 5(B). L2 of FIG. 5(B) represents the depth of the second hole after forming the fourth film and further removing the first insulating film exposed in the lower part of the second hole.

The aspect ratio of the second hole formed in this step is preferably 13 or more, more preferably 15 or more. Furthermore, it is preferably 25 or less, more preferably 20 or less. If the aspect ratio of the second hole is within this range, a bowing shape would more noticeably occur in a conventional production method. However, by using the production method of the present invention, occurrence of the bowing shape can be prevented more effectively.

Step (6)

Next, the first insulating film exposed in the lower part of the second hole is removed by anisotropic etching. In this connection, this step (6) may be carried out before step (7) or after step (7).

If step (6) is carried out before step (7), the first insulating film exposed in the lower part of the second hole is removed by anisotropic etching, followed by extending by isotropic etching a side surface portion of the second hole extended in step (5), on which the fourth film is not formed. When the anisotropic etching and isotropic etching are carried out, conditions are set such that the third insulating film and the fourth film act as a mask and a contact plug 205 is not etched.

If step (6) is carried out after step (7), a side surface portion of the second hole extended in step (5), on which the fourth film is not formed, is extended by isotropic etching, followed by removing by anisotropic etching the first insulating film exposed in the lower part of the second hole. When the anisotropic etching is carried out, conditions are set such that the third insulating film and the fourth film act as a mask. When the isotropic etching is carried out, conditions are set such that the third insulating film and the fourth film act as a mask and an insulating film 200 and the contact plug 205 are not etched. In this connection, the first insulating film may act as an etching stopper at the time of the isotropic etching. Therefore, a bowing shape does not occur in the second hole in any etching step of steps (6) and (7).

Step (7)

Thereafter, a side surface portion of the second hole extended in step (5), on which the fourth film is not formed, is extended by isotropic etching using the third insulating film and the fourth film as a mask with etching conditions adjusted. However, the isotropic etching is completed before adjacent holes contact each other, and it is made certain that an interlayer insulating film exists between adjacent holes. By this step, the diameter of a portion of the second hole on the first insulating film side (lower part of the hole) can be increased. As a result, a stable storage node can be formed without causing a decrease in capacitance.

As isotropic etching, wet etching is preferably carried out. By carrying out wet etching, the lower part of the second hole can effectively be extended to a desired hole diameter without damaging the first insulating film.

In this connection, the adjustment of etching conditions for etching carried out in steps (3) to (7) can be made by adjusting, for example, the type/flow rate/pressure of a gas for etching, the pressure in a vessel in which etching is carried out, the temperature/time period during etching, the applied voltage and the like in the case of dry etching. In the case of wet etching, the adjustment of conditions can be made by adjusting the composition of an etching solution, the temperature/time period during etching and the like.

One example of the production method of the present invention will be described in detail below using process sectional views of FIGS. 4(A) to 4(D), 5(A) to 5(D) and 6(A) and 6(B). A structure in which an insulating film (substrate) 200 composed of a silicon oxide film is formed on a silicon substrate (not shown) on which an MOS (metal oxide semiconductor) transistor constituting a DRAM (dynamic random access memory) cell is formed is prepared. On this insulating film 200 are formed a stopper layer (the first insulating film) 201, an interlayer insulating film (the second insulating film) 202 and a hard mask layer (the third insulating film) 203 for etching in this order using a normal CVD method (step (1)). In this connection, the interlayer insulating film 202 is formed so as to have a thickness such that the aspect ratio of the second hole formed in step (5) exceeds 12 in relation to the entrance hole diameter of the second hole.

In this connection, in the insulating film 200 is formed a contact plug 205 extending through the insulating film 200 and connected to the MOS transistor constituting the DRAM cell. In this embodiment, a silicon nitride film having a thickness of 15 nm is used for the stopper layer 201, a silicon oxide film having a thickness of 3000 nm is used for the interlayer insulating film 202, and a non-doped polysilicon film having a thickness of 100 nm is used for the hard mask layer 203. The silicon oxide film and non-doped polysilicon film may be formed by, for example, a plasma CVD method.

Next, by a photolithography technique, a circular hole having a diameter of 120 nm is provided in a photoresist (not shown) formed on the hard mask layer 203, the hard mask layer 203 is dry-etched in a thickness direction 303 thereof using the photoresist as a mask to form the first hole (part surrounded by a dotted line) 301, and a hard mask layer 203 for etching is formed (step (2)). Thereafter, the photoresist is removed (FIG. 4(A)).

The interlayer insulating film 202 in the lower part of the first hole is anisotropically dry-etched in a direction 303 using the hard mask layer 203 as a mask to form the second hole (part surrounded by a dotted line) 302 of an aspect ratio of 7 or more and 12 or less having a depth at which a bowing shape does not occur (FIG. 4(B): step (3)). Next, a polysilicon film (the fourth film) 204 having a thickness of 4 nm is formed on the entire surface by a low pressure CVD method (FIG. 4(C)).

The polysilicon film 204 may be an insulating film or may be a conductive film, but if a capacitor capacitance of the DRAM is formed, the polysilicon film 204 is preferably conductive polysilicon film (doped polysilicon).

Next, the polysilicon film 204 is etched using an anisotropic dry etching method, the polysilicon film 204 formed on the bottom of the second hole 302 and the top surface of the polysilicon film 203 is removed, and the polysilicon film 204 is formed (left) on the side surfaces of the first hole 301 and the second hole 302 (FIG. 4(D): step (4)).

At this time, the polysilicon film 204 left on the side surface of the second hole 302 covers at least a position of an aspect ratio of 2 to 7 in which a bowing shape occurs in the second hole 302 formed in step (3). Thereafter, anisotropic etching is carried out in the direction 303 using the hard mask layer 203 and the polysilicon layer 204 as a mask and using the stopper layer 201 as an etching stopper to remove the interlayer insulating film 202 until the stopper layer 201 is exposed on the bottom surface. The second hole 302 of an aspect ratio greater than 12 is formed by this step (FIG. 5(A): step (5)).

At this time, the stopper layer 201 is not etched by etching of the interlayer insulating film 202 because it is a silicon nitride film. Furthermore, a region in which a bowing shape easily occurs is covered with a polysilicon layer hard to be etched by etching of the interlayer insulating film 202 by step (4). Therefore, any bowing shape does not occur in the second hole 302 even though the interlayer insulating film 202 is etched under conditions for carrying out over-etching.

Thereafter, the silicon oxide film exposed in the lower part of the second hole 302 is etched away by isotropic etching, and then the stopper layer 201 exposed on the bottom surface of the second hole 302 is then etched away using anisotropic dry etching (FIG. 5(B): step (6)). The insulating film 200 and the contact plug 205 are exposed on the bottom surface of the second hole 302.

In this step, the interlayer insulating film 202 is not left on the bottom of the second hole because the interlayer insulating film 202 is over-etched by anisotropic etching and further is isotropically etched. By subsequent anisotropic dry etching, the stopper layer is etched, so that the insulating film 200 and the contact plug 205 are exposed on the bottom of the second hole.

Thus, when the stopper layer 201 is etched in step (6), a region of an aspect ratio of 2 to 7 in the second hole 302 formed in step (3), in which a bowing shape easily occurs, is covered with the polysilicon layer 204 hard to be etched at the time of etching of the stopper layer 201. Therefore, when the stopper layer 201 is etched, a bowing shape does not occur in the second hole.

Further, at the next step, a side surface portion of the second hole extended in step (5), on which the fourth film is not formed, is extended by isotropic etching using the third insulating film and the fourth film as a mask (FIG. 5(C): step (7)).

At this time, a side surface portion in the upper part of the second hole 302 is covered with polysilicon film 204 which is not etched by isotropic etching. Therefore, only the lower part of the second hole having a reduced hole diameter can be made to have the hole diameter enlarged selectively.

For the isotropic etching, any of a wet etching method and a dry etching method may be used, but the wet etching method is preferably used. In the case of the wet etching method, a BHF solution ($NH_4F/HF/H_2O$) may be used.

Subsequently, a pretreatment intended for removal of a thin oxide film is carried out using a fluoric acid based agent liquid, and a polysilicon film 206 injected with an impurity on the entire surface is then formed, whereby the polysilicon film 206 as a lower electrode is formed in the second hole 302 (FIG. 5(D)). Thereafter, the hard mask layer 203 and polysilicon films 204 and 206 provided on the top surface and the side surface of the hard mask layer 203 are removed by a CMP (chemical mechanical polishing) method or an etch back method to form a lower electrode of a capacitor (FIG. 6(A)).

Figure 6:
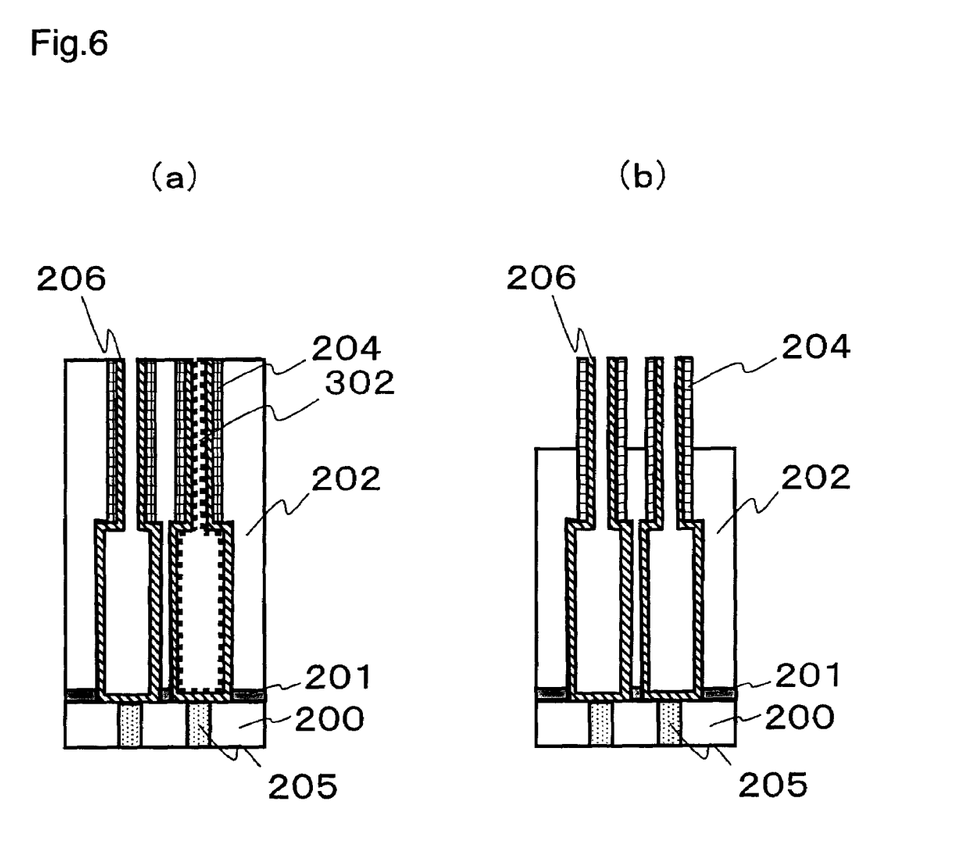
FIGS. 6(A) and 6(B) are process sectional views for explaining one example of production steps for the semiconductor device.

Furthermore, thereafter, the top of the second insulating film 202 may be partly removed to expose a part of the lower electrode (polysilicon film) 206 (FIG. 6(B)). Even though the lower electrode is thus exposed, the slant of the lower electrode can be prevented to prevent a short circuit with a capacitor by adjusting the height of the exposed lower electrode. Thereafter, a capacitive dielectric film (not shown) is laminated on the lower electrode and further, an upper electrode (not shown) is formed to complete a cylinder type capacitance of the DRAM.

In the present invention, a semiconductor device having a hole extending through the first insulating film, the second insulating film as an interlayer insulating film and the third insulating film can be produced without causing a bowing shape to occur in the hole. Such a semiconductor device may be, for example, a cylinder capacitance produced by the production method described above. Furthermore, it may be a contact hole (hole for contact between parts of an element constituting front-end and a wiring layer above them), a via hole (hole wiring connecting a lower wiring layer and an upper wiring layer), or the like. In this connection, when the contact hole or the via hole is formed, the fourth film may remain.

What is claimed is:

1. A method for production of a semiconductor device having a first insulating film, a second insulating film as an interlayer insulating film and a third insulating film on a substrate in this order and having a hole extending through the first insulating film, the second insulating film and the third insulating film, the method comprising:

depositing the first insulating film, the second insulating film and the third insulating film on the substrate in this order;

forming a first hole extending through the third insulating film along a direction of the thickness thereof;

forming a second hole in the second insulating film in the lower part of the first hole to a depth at which a bowing shape does not occur by anisotropic etching using the third insulating film as a mask;

forming a fourth film on the side surfaces of the first and the second holes;

forming a third hole of an aspect ratio greater than twelve by extending the second hole until the first insulating film is exposed by carrying out anisotropic etching using the third insulating film and the fourth film as a mask and using the first insulating film as an etching stopper;

removing the first insulating film exposed in the lower part of the third hole by anisotropic etching; and extending a side surface portion of the third hole, on which the fourth film is not formed, by isotropic etching using the third insulating film and the fourth film as a mask.

2. The method for production of a semiconductor device according to claim 1, wherein the first insulating film is a silicon nitride film, the second insulating film is a silicon oxide film, the third insulating film is a non-doped polysilicon film and the fourth film is a polysilicon film.

3. The method for production of a semiconductor device according to claim 2, wherein the polysilicon film constituting the fourth film is a conductive polysilicon film containing an impurity.

4. The method for production of a semiconductor device according to claim 1, wherein the depth at which the bowing shape does not occur is a depth at which the aspect ratio of the second hole is seven or more and twelve or less.

5. The method for production of a semiconductor device according to claim 1, wherein the isotropic etching is wet etching.

6. The method for production of a semiconductor device according to claim 1, wherein the fourth insulating film is layered on the third insulating film, the third insulating film is layered on the second insulating film, and the second insulating film is layered on the first insulating film.

7. The method for production of a semiconductor device according to claim 1, further comprising forming a contact plug extending through the substrate and contacting the first insulating layer.

8. The method for production of a semiconductor device according to claim 1, wherein the first insulating film is a stopper layer, and the third insulating film is a hard mask layer.

* * * * *